United States Patent
Burger et al.

(10) Patent No.: US 6,793,978 B2
(45) Date of Patent: Sep. 21, 2004

(54) METHOD AND DEVICE FOR COATING AT LEAST ONE WIPER-BLADE ELEMENT

(75) Inventors: Kurt Burger, Friolzheim (DE); Guenter Schneider, Besigheim (DE); Klaus Burghoff, Gerlingen (DE); Thomas Weber, Stuttgart (DE); Jeanne Forget-Funk, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 73 days.

(21) Appl. No.: 10/049,763

(22) PCT Filed: May 9, 2001

(86) PCT No.: PCT/DE01/01769

§ 371 (c)(1),
(2), (4) Date: Jun. 4, 2002

(87) PCT Pub. No.: WO01/89893

PCT Pub. Date: Nov. 29, 2001

(65) Prior Publication Data

US 2002/0164422 A1 Nov. 7, 2002

(30) Foreign Application Priority Data

May 24, 2000 (DE) .......................................... 100 25 689

(51) Int. Cl.[7] .............................................. C23C 16/50
(52) U.S. Cl. ........................ 427/497; 427/569; 427/534; 427/535; 427/248.1; 427/249.7; 427/255.5; 427/509; 118/719; 118/723 R; 118/723 MP; 118/723 E
(58) Field of Search ................................ 427/497, 509, 427/569, 534, 535, 248.1, 249.7, 255.5; 118/719, 723 R, 723 MP, 723 F

(56) References Cited

U.S. PATENT DOCUMENTS 6,287,642 B1 * 9/2001 Leutsch et al. ............. 427/536

FOREIGN PATENT DOCUMENTS

| DE | 198 14 805 A1 | 10/1999 | |
|----|---------------|---------|---|
| EP | 0 264 227 A2 | 4/1988 | |
| EP | 264227 A2 * | 4/1988 | .............. C08J/7/12 |
| EP | 0 821 077 A | 1/1998 | |
| EP | 821077-a3 * | 6/2000 | |
| JP | 10035418 A * | 2/1998 | ............. B60S/1/38 |
| WO | 99 51471 A | 10/1999 | |

* cited by examiner

Primary Examiner—Timothy Meeks
(74) Attorney, Agent, or Firm—Michael J. Striker

(57) ABSTRACT

The invention is based on a method for coating at least one wiper blade element (10) made of an elastomer material, in which first, the surface of the wiper blade element (10) is cleaned and activated by means of a plasma, and then in a CVD process, a coating material is brought into a plasma state and at least one protective coating (64) forms on the surface of the wiper blade element (10), where a high-frequency voltage is applied to the region of the wiper blade element (10) oriented away from the protective layer (64) by means of an electrode (56).

The invention proposes that before being brought into a treatment chamber (32, 34, 36, 38, 40, 74), the wiper blade element (10) be cut to a useful length (66) from a profiled band and placed on an electrode plate (56) so that its wiper lip (18) stands approximately perpendicular to the electrode plate (56), which extends to both sides of the wiper blade element (10), and is subjected to a plasma flow (50).

23 Claims, 4 Drawing Sheets

METHOD AND DEVICE FOR COATING AT LEAST ONE WIPER-BLADE ELEMENT

BACKGROUND OF THE INVENTION

The invention is based on a method for coating at least one wiper blade element.

Wiper blade elements for vehicle window wipers are produced in mass quantities, typically more than ten thousand per day. They are cut from a rubber strip that has been extruded and then vulcanized.

DE 198 14 805 A1 has disclosed a method for coating a wiper blade element, in which at least one protective coating is produced on the surface of the extruded, elastomer material of the wiper blade element by means of a CVD process (Chemical Vapor Deposition) in order to improve the abrasion and sliding properties of the wiper blade element. So that the protective coating adheres better to the base material, the surface of the wiper blade element is pretreated by being cleaned and activated with a plasma. A layer of bonding agent can also be applied.

It is also known that a bias voltage applied to the wiper blade element causes the plasma-aided depositing of the protective coating to produce denser and more abrasion resistant coatings. In this connection, the wiper blade element is conveyed past an electrode to which a bias voltage is applied. This bias voltage, also referred to as priming voltage, is supplied pulsed or unpulsed in opposition to ground or a counter-electrode. In this connection, pulse frequencies of between 10 kHz and a few MHz are used, preferably from 50 to 250 kHz. The bias voltage can, however, also be supplied by a frequency source at frequencies between 1 kHz and 100 MHz, preferably from 50 kHz to 27 MHz, in particular 13.56 MHz. The bias voltage accelerates ions from the plasma in the direction of the surface of the wiper blade element. These ions strike the previously deposited coating and cause a cross-linking and densification of the coating. The bias voltage advantageously occurs automatically and can assume a value between a few volts and 2 kV.

In order to be able to treat and coat mass quantities of wiper blade elements, the coating is preferably integrated into a continuous production flow, which can save space, time, and expense. Continuous concepts particularly suited for this are those in which the wiper blade elements are extruded in a long strand and are conveyed through the differentially pumped vacuum chamber or reaction chamber at atmospheric pressure, past the coating sources. The coupling of two critical manufacturing steps, namely of extrusion and coating of the wiper blade element, however, causes the entire production line to come to a halt when there is a breakdown in one part of the manufacturing system and generates a greater amount of manufacturing rejects. In addition, the protective coating at the ends of the wiper blade element can be damaged in the final cutting procedure.

EP 0 264 227 A2 has also disclosed a wiper blade element for window wipers which is comprised of a high-molecular material. The group of materials includes, among others, natural rubber, synthetic rubber, elastomers, synthetic plastics, and the like. The surface of the wiper blade element is given a polymer protective coating, which is formed directly from a monomeric gas through the use of plasma energy.

SUMMARY OF THE INVENTION

According to the invention, the wiper blade element is cut to a usable length from a profiled band before being brought into a treatment chamber, is placed on the electrode plate, and is subjected to a plasma flow.

The individual treatment steps are advantageously executed one after another in a treatment chamber in a so-called single-chamber batch process or in mass quantities in a multiple-chamber batch process with a number of treatment chambers. In a functional manner, a single treatment step is executed in each chamber, where cycle times between the individual treatment steps can be between 10 seconds and several minutes. Cycle times between 30 seconds and 1 minute have turned out to be particularly favorable. The batch process permits the production-critical processes of the rubber shaping and the coating to be decoupled. If malfunctions occur in one manufacturing process, this has no influence on the other manufacturing process. As a result, the risk of rejects is also reduced. In contrast to continuous systems, a coating system with a number of treatment chambers can be embodied in a more favorably priced, flexible manner since a number of similar treatment chambers can be operated in parallel, depending on the treatment duration. This produces particularly positive results if the pretreatment takes place at a slight vacuum of approximately 0.1 to 100 mbar.

The wiper blade elements can be suitably cut from an extruded double-strand profile in which the wiper lips are oriented toward each other and connected to each other via an intermediary piece. One side of the wiper lips rests against the electrode plate. After the first side is coated, the wiper blade element must be turned over inside or outside of the treatment chamber. When the coating is completed, the wiper lips are cut from the intermediary piece. It is also possible to cut the wiper lips apart from each other before the coating.

In a variant of the invention, the wiper blade elements are arranged so that the wiper lips stand approximately perpendicular to the electrode plate, which extends on both sides of the wiper blade element. Thus, both sides of the wiper lip of the wiper blade element can be treated and coated at the same time. A number of wiper blade elements can be arranged next to one another and in series on an electroplate, which represents a part of a merchandise carrier. They can be of different lengths and have different profiles.

The electrode plate suitably engages laterally in longitudinal grooves of the wiper blade element, which are provided for claw brackets or spring strips, so that the wiper blade elements are securely fixed to the electrode plate. This makes a flexible large-scale manufacture possible. Furthermore, cutting processes after coating, which could damage the protective coating, can be eliminated.

The electrode plate suitably has an alternating current applied to it, with a frequency of 10 kHz to a few MHz, preferably 13.56 MHz, where the power to be coupled-in is approximately 1 to 100 $W/cm^2$ of electrode surface area. Depending on the coupled-in power, the overall pressure, and the surface area ratios, a negative potential (self bias) occurs in the plasma between the electrode plate and ground. This potential engages through the rubber of the wiper blade element and accelerates the ions in the plasma toward the surface of the rubber. This ion bombardment causes a compaction of the coating and thus increases the coating hardness. The effectiveness of the ion bombardment depends on the thickness of the dielectric disposed on the electrode plate, i.e. the thickness of the elastomer material.

An increase in the distance between the electrode and the rubber surface decreases the potential induced on the surface by the self bias voltage. Through the invention's disposition of the wiper blade element on the electrode plate, the ion bombardment and the resulting coating hardness vary as a result of the varying distance of the wiper lip and the fastening part from the electrode plate. Thus, a hardness and coating thickness gradient can be produced, which ranges from a softer coating on the wiper lip to a harder coating on the profiled back. However, the thickness and hardness of the protective coating directly on the wiper lip are crucial to the functionality of the wiper blade element. The coating thickness and coating hardness that occurs on the fastening part have only a negligible impact on the wiping process. Since the potential occurring in the electrode plate reaches both sides of the wiper lip, both sides of the wiper lip can advantageously be coated at the same time. In order to influence the negative potential that occurs and to optimize it with regard to the respective sort and type of wiper blade element, one embodiment of the invention proposes fully or partially covering the electrode plate with an insulating material. Thus, the area in contact with the plasma can be modified and the self bias voltage occurring in the electrode plate can be adjusted.

The gas is introduced into the treatment chambers by means of gas nozzles; the openings of the nozzles are oriented toward the wiper lips of the wiper blade elements introduced. Low-molecular, cross-linkable, gaseous materials, halogen-containing, silicon-containing, carbon-containing, or metal-organic monomers are suitable as coating materials. One or more gas nozzles can be associated with one or more wiper blade elements in order to assure a uniform coating of a batch. In addition, conveying apparatuses for the gas can be provided in the treatment chambers. These can be comprised in that gas slots are disposed at the longitudinal sides of the wiper blade elements, lateral to the electrode plates, or in the electrode plates, through which the gas is aspirated by a vacuum pump. In addition, gas baffles can also be disposed in the treatment chamber.

If a number of treatment chambers are provided, they can be arranged in a line and interlinked with one another by means of a transport mechanism. Depending upon the availability of space, it can be advantageous to arrange a number of treatment chambers in a closed configuration. In this connection, it is possible to use one treatment chamber for loading and unloading the merchandise carriers with the wiper blade elements.

BRIEF DESCRIPTION OF THE DRAWINGS

Other advantages ensue from the following description of the drawings. Exemplary embodiments of the invention are shown in the drawings. The drawings, the specification, and the claims contain numerous features in combination. The specialist will also suitably consider the features individually and unite them in other meaningful combinations.

DETAILED DESCRIPTION OF THE PREFERRED EMBODIMENTS

Figure 1:
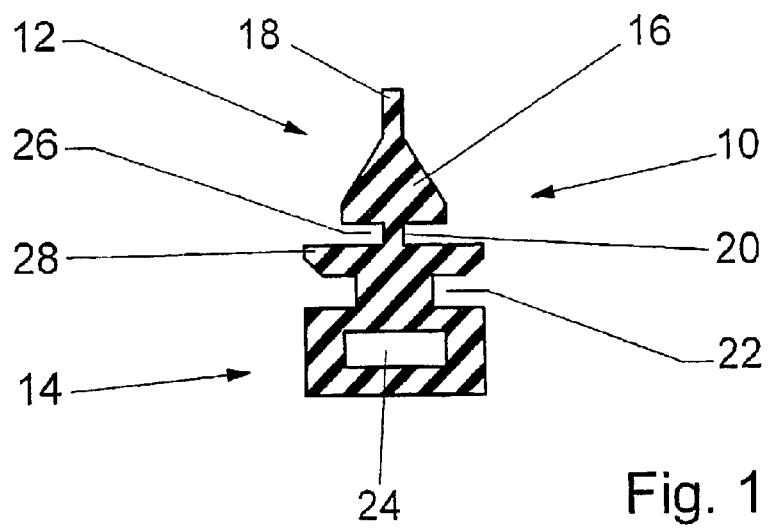
FIG. 1 shows a cross section through a wiper blade element.

The wiper blade element 10 according to FIG. 1 has a profiled back 14 and an operational part 12 with a wiper wedge 16 and a wiper lip 18 formed thereon. A tilting piece 20 connects the operational part 12 to the profiled back 14 and permits the wiper lip 18 to tilt over in the reversal positions of the wiper so that the wiper lip 18 encloses an acute angle with the vehicle window in the wiping direction. Along both sides of the tilting piece 20, longitudinal grooves 26 are formed between the wiper wedge 16 and a covering strip 28 of the profiled back 14. In the tilting motion, one shoulder of the wiper wedge 16 rests against the covering strip 28 and this limits the tilting motion. In addition, claw grooves 22 extend on both sides of the profiled back 14 and are engaged by the claws of a claw bracket of the wiper, which are not shown in detail. Finally, the profiled back 14 has a longitudinal channel 24 into which a spring strip, not shown in detail, is inserted in order to stiffen the wiper blade element 10.

In order to improve the sliding and abrasion properties of the wiper blade elements 10, in particular of the wiper lip 18 and the wiper wedge 16, a protective coating 64 can be applied to the surface of the wiper blade element 10, preferably by means of a PECVD process (Plasma-Enhanced Chemical Vapor Deposition). Low-molecular, cross-linkable, gaseous materials, halogen-containing, silicon-containing, carbon-containing, or metal-organic monomers are suitable as a coating material, which is activated by means of a plasma.

Figure 2:
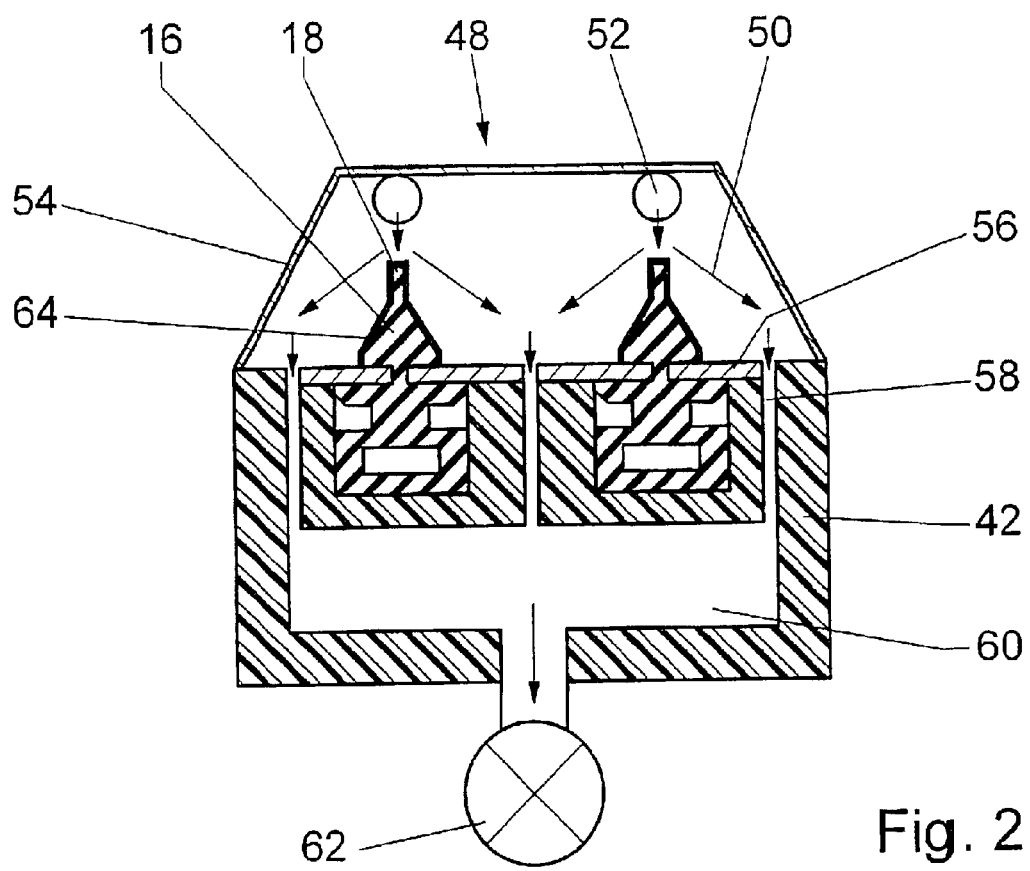
FIG. 2 is a schematic cross section through a treatment chamber.
Figure 4:
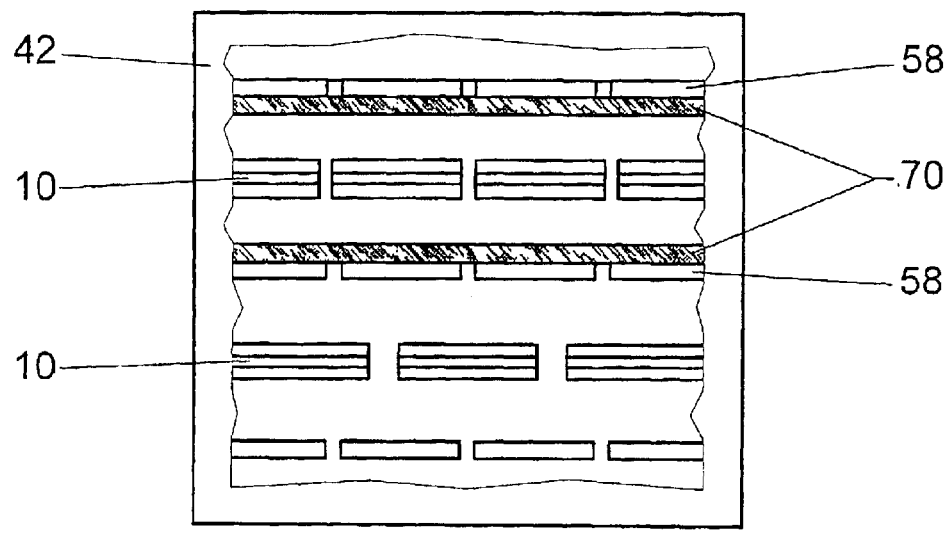
FIG. 4 shows a merchandise carrier loaded with various wiper blade elements.

Before the wiper blade element 10 is coated, it is cut to a usable length from an extruded, profiled strand and is placed in a merchandise carrier 42 (FIG. 2). A number of wiper blade elements 10, even of different lengths and with different profiles, can be arranged in series one behind the other and in rows parallel to one another (FIG. 4). The wiper blade elements 10 are inserted into the merchandise carrier 42 so that their wiper lips 18 stand approximately perpendicular to electrode plates 56 which suitably engage laterally in the longitudinal grooves 26 or claw grooves 22. Gas nozzles 52 are provided opposite from the wiper lips 18 and gas jets 50 of the gaseous coating material flow out of the openings of these nozzles. The gas can be intentionally directed at the wiper lips 18 or can circulate diffusely around the wiper lips 18. The gas flowing from the gas nozzles 52 can also be conveyed by means of gas baffles 54 and gas slots 58 between the wiper blade elements 10 and can be aspirated by a gas pump 62 from a collection chamber 60 disposed on the side of the wiper blade element 10 remote from the gas nozzles 52. The gas nozzles 52 are suitably combined in gas frameworks 48, where one or more gas nozzles 52 can be associated with one or more wiper lips 18. With the method according to the invention, both sides of the wiper lips are advantageously treated and coated at the same time.

Figure 3:
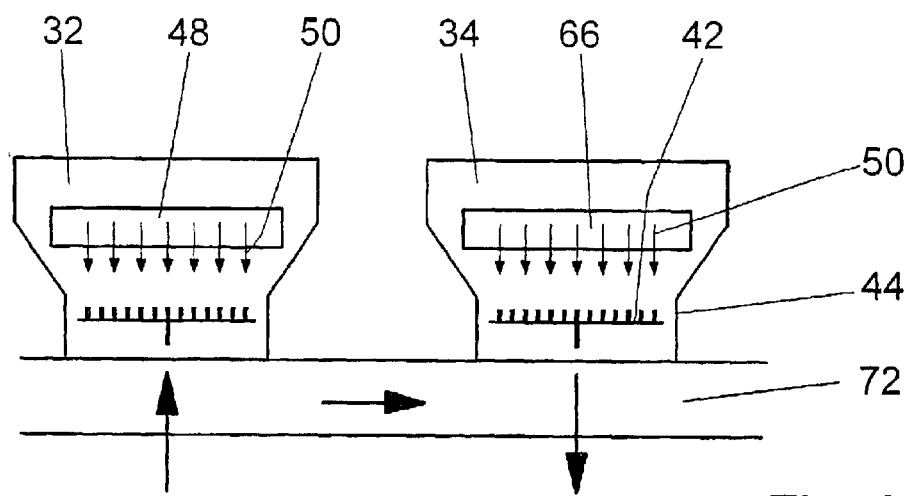
FIG. 3 shows a linear arrangement of two treatment chambers.

The coating process takes place in a treatment chamber 32, 34 (FIG. 3) and/or in a treatment chamber 38 or 40 (FIG. 5), in pressure ranges from $10^{-2}$ to 100 mbar. Through the direct influx of coating-forming gasses into a plasma ignited with high frequency, deposition rates are achieved that are ten to thirty times greater than in conventional coating methods. During the coating, a high-frequency alternating current in a frequency range from 10 kHz to several MHz, preferably 13.56 MHz, is applied to the electrode plates. The power to be coupled-in depends on the electrode surface area and is approximately 1 to 100 W/cm$^2$. If the pressure in the treatment chamber 32, 34, 38, 40 is decreased into a range from 100 mbar to $10^{-2}$ mbar, then the plasma ignites on the electrode plate 56 and around the wiper lip 18. In the electrode plate 56, depending on the power coupled-in, the overall pressure, and the surface area ratios, this produces a negative potential (self bias) between the electrode plate 56 and ground. The surface area of the electrode plate 56 can be modified by covering it partially or completely with an insulating material 70.

The negative potential engages through the rubber of the wiper blade element 10 and causes the ions in the plasma to be accelerated toward the rubber surface. This ion bombardment produces a compaction of the protective coating 64 and thus increases the coating hardness. The effectiveness of the ion bombardment depends on the thickness of the dielectric disposed on the electrode plate 56, in this case the elastomer material of the wiper blade element 10. An increase in the distance between the electrode plate 56 and the rubber surface decreases the potential that the self bias voltage induces on the surface. Consequently, the ion bombardment and the resulting coating hardness vary between the wiper lip 18 and the profiled back 14. The hardness of the protective coating 64 increases in accordance with the hardness and coating gradients, from the wiper lip 18 to the profiled back 14. The thickness and hardness of the protective coating 64 on the wiper lip 18 are important for the functionality of the wiper blade element 10. The coating thickness of the protective coating 64 and the coating hardness that occur on the profiled back 14 only have a negligible influence on the wiping process. In order to obtain a better wiping pattern, it can be advantageous to cut or recut the wiper lip 18 only after the coating.

So that the protective coating 64 adheres better to the base material of the wiper blade element 10, it is useful to clean and activate the surface of the wiper blade element with a plasma-aided process. This occurs in a pretreatment process at a pressure of approximately 0.1 to 100 mbar. A thin layer of bonding agent can also be applied to the wiper blade element 10.

In principle, the different treatment steps can be executed sequentially in one treatment chamber 32, 34, 36, 38, 40, but it is advantageous to execute the treatment steps in different treatment chambers 32, 34, 36, 38, 40, where the wiper blade elements 10 are conveyed with their merchandise carrier 42 and a transport housing 44 by means of a conveying mechanism, e.g. a circular conveyor 46, from one treatment chamber 32 to the next treatment chamber 34. In a system according to FIG. 3, two treatment chambers 32 and 34 are interlinked by means of a linear conveyor 72. In this instance, the treatment chamber 32 can simultaneously be used for loading a merchandise carrier 42 while the treatment chamber 34 can simultaneously be used as an unloading station. In addition, the pretreatment can take place in the treatment chamber 32, while the actual coating process is executed in the treatment chamber 34.

Figure 5:
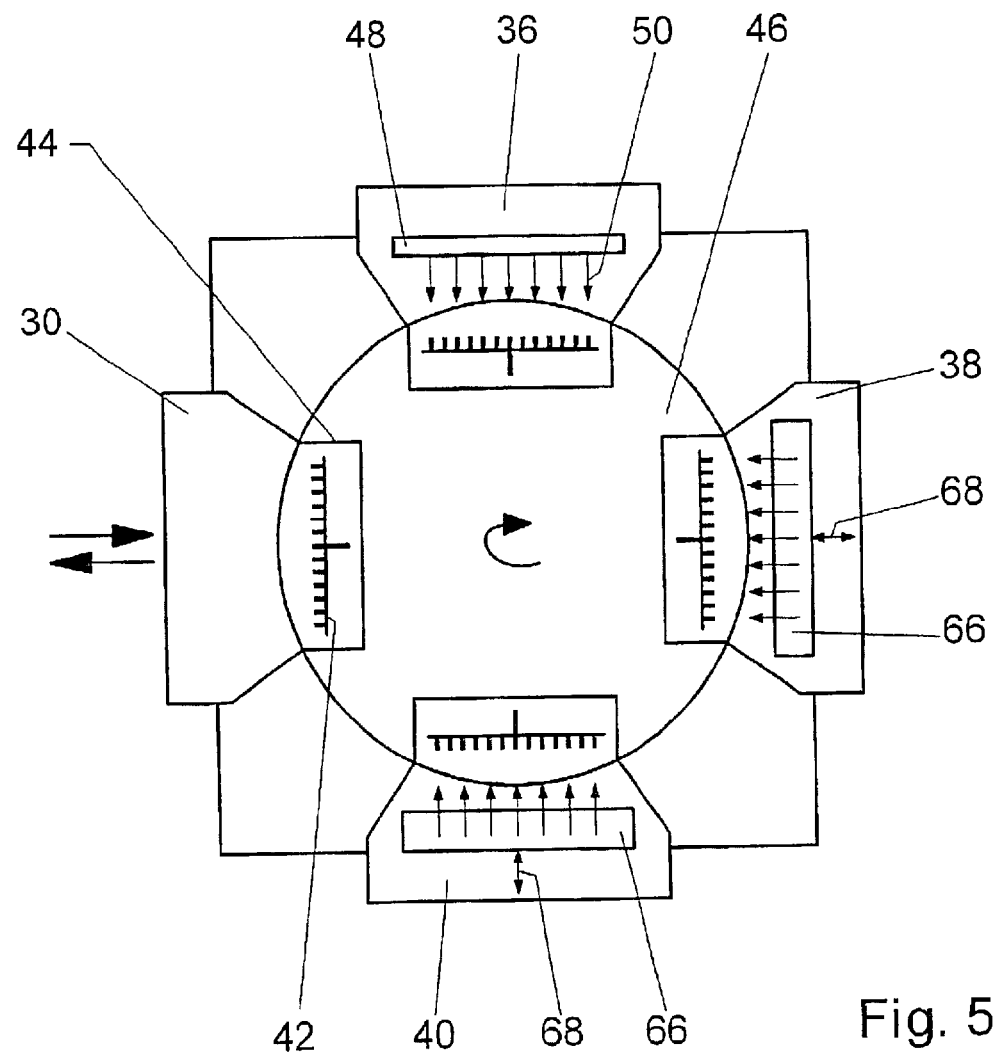
FIG. 5 shows an arrangement of four treatment chambers in a closed configuration.
Figure 6:
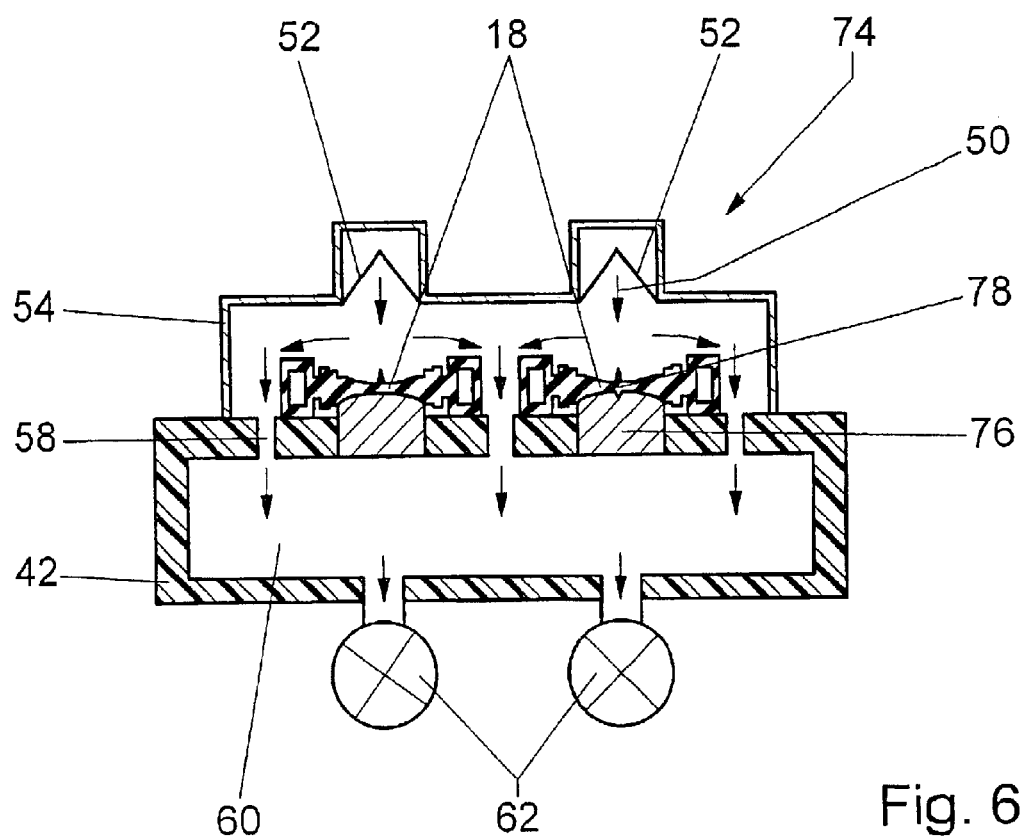
FIG. 6 shows a variant of FIG. 2.

In the system according to FIG. 5, a loading and unloading chamber 30 is disposed in a circle with three treatment chambers 36, 38, and 40 and they are connected to one another by means of a circular conveyor 46. The merchandise carriers 42 are brought into and out of the system at atmospheric pressure in the loading and unloading chamber 30. Whereas the pretreatment of the wiper blade element 10 occurs in the treatment chamber 36, two subsequent treatment chambers 38 and 40 are provided for the coating of the wiper blade element 10. The number of treatment chambers 38, 40 can vary depending on the duration of the total coating process and/or the desired cycle time. In order to be able to modify the coating thickness on the wiper blade element 10, the gas framework 66 can be moved in the direction of the arrow 68 inside the treatment chambers 38 and 40 so that the distance of the gas nozzles 52 from the wiper lips 18 can be varied.

In a variant according to FIG. 5, the wiper blade element 10 is disposed in a prone position, with one side of the wiper lip 18 resting against an electrode plate 76. The plasmafied gas jets 50 are directed toward the wiper lip 18 and are conveyed by the gas baffles 54 through the gas slots 58 into the collecting chamber 60. Gas pumps 62 aspirate the excess gas and produce a desired negative pressure. After the first side of the wiper lip 10 is coated, the wiper blade element is turned over inside or outside the treatment chamber 74.

The wiper lips 10 are suitably extruded in a double strand in which the wiper lips 18 are connected to each other by means of an intermediary piece 78. The wiper lips 18 can be separated before or after the coating by being cut along the intermediary piece 78. Several rows of different wiper blade elements 10 can be disposed on the merchandise carrier 42.

What is claimed is:

1. A method for coating at least one wiper blade element (10) made of an elastomer material, in which first, the surface of the wiper blade element (10) is cleaned and activated by means of a plasma, and then in a CVD process, a coating material is brought into a plasma state and at least one protective coating (64) forms on the surface of the wiper blade element (10), where a high-frequency voltage is applied to the region of the wiper blade element (10) oriented away from the protective layer (84) by means of an electrode plate wherein before being brought into a treatment chamber (32, 34, 36, 38, 40, 74), the wiper blade element (10) is cut to a useful length (86) from a profiled band, is placed on the electrode plate (56L 76) of a merchandise carrier (42), and is subjected to a plasma flow (50).

2. The method according to claim 1, wherein the treatment steps are executed in a single-chamber or multiple-chamber batch process, with cycle times between 10 seconds and a few minutes.

3. The method according to claim 2, wherein the cycle times are between 30 seconds and one minute.

4. The method according to claim 1, wherein the pretreatment takes place at a pressure of approximately 0.1 to 100 mbar.

5. The method according to claim 1, wherein a thin bonding agent is applied to the wiper blade element (10).

6. The method according to claim 1, wherein the coating material, which is activated by means of a plasma, is comprised of low-molecular weight, cross-linkable, gaseous materials, halogen-containing monomers silicon-containing monomers, carbon-containing monomers, or metal-organic monomers.

7. The method according to claim 6, wherein the high-frequency voltage that is applied to the electrode plate (56) has a frequency of ten kHz to a few MHz, preferably 13.56 MHz, and the power to be coupled-in has approximately one to a hundred Watts per $cm^2$ of electrode surface area.

8. The method according to claim 1, wherein the wiper blade element (10) rests with one side of the wiper lip (18) against the electrode plate (76).

9. The method according to claim 8, wherein two wiper blade elements (10) rest on the electrode plate (76), with wiper lips (18) oriented toward each other.

10. The method according to claim 9, wherein two wiper blade elements (10) with wiper lips (18) oriented toward each other, are connected at the wiper lips by means of an intermediary piece (78) and are separated after the coating is applied.

11. The method according to claim 1, wherein the wiper lip (18) of the wiper blade element (10) stands approximately perpendicular to the electrode plate (56), which extends on both sides of the wiper blade element (10).

12. The method according to claim 11, wherein the electrode plate (56) engages laterally in longitudinal grooves (22, 26) of the wiper blade element (10).

13. The method according to claim 1, wherein the treatment steps are executed sequentially in different treatment chambers (32, 34, 36, 38, 40).

14. A device for executing the method according to claim 1, wherein the treatment chambers (32, 34, 36, 38, 40) have gas nozzles (52) whose openings are oriented toward the wiper lips (18) of the inserted wiper blade elements (10).

15. The device according to claim 14, wherein one or more gas nozzles (52) are associated with one or more wiper blade elements (10).

16. The device according to claim 14, wherein gas slots (58) are disposed at the longitudinal sides of the wiper blade element (10), lateral to the electrode plates (5, 76), and gas is aspirated through these slots by a gas pump (62).

17. The device according to claim 14, wherein gas baffles (64) are disposed in the treatment chambers (34, 36, 38, 40, 74).

18. The device according to claim 14, wherein the electrode plate (56, 76) is at least partially covered with insulating material (70).

19. The device according to claim 14, wherein the electrode plate (56, 76) is equipped to receive one or more wiper blade elements (10).

20. The device according to claim 14, wherein a number of treatment chambers (36, 38, 40) are arranged in a line.

21. The device according to claim 14, wherein a number of treatment chambers (36, 38, 40) are arranged in a dosed configuration.

22. The device according to claim 14, wherein the wiper blade elements (10) and the electrode plates (56) are disposed on a merchandise carrier (42), which is fastened to a transport mechanism (46) for conveying the wiper blade elements (10) from one treatment chamber (36, 38, 40, 74) to the others.

23. The device according to claim 22, wherein at least one treatment chamber (32, 34) is also used for the loading and/or unloading of merchandise carriers (42).

\* \* \* \* \*